United States Patent [19]

Herd et al.

[11] Patent Number: 5,032,869
[45] Date of Patent: Jul. 16, 1991

[54] AXIAL THERMAL SHIELD SUPPORT FOR A MR MAGNET

[75] Inventors: Kenneth G. Herd; Evangelos T. Laskaris; Mark E. Vermilyea, all of Schenectady, N.Y.

[73] Assignee: General Electric Company, Schenectady, N.Y.

[21] Appl. No.: 505,631

[22] Filed: Apr. 6, 1990

[51] Int. Cl.$^5$ .............................................. H01F 7/22
[52] U.S. Cl. ...................... 335/216; 174/15.4; 62/51.1
[58] Field of Search ............... 335/216, 299; 174/15.4; 62/51.1, 259.2

[56] References Cited

U.S. PATENT DOCUMENTS

| | | | |
|---|---|---|---|
| 4,777,807 | 10/1988 | White | 62/51.1 |
| 4,783,628 | 11/1988 | Huson | 335/216 X |
| 4,943,781 | 7/1990 | Wilson et al. | 335/216 X |

Primary Examiner—George Harris
Attorney, Agent, or Firm—James R. McDaniel; James C. Davis, Jr.; Paul R. Webb, II

[57] ABSTRACT

Two pair of thermal shield axial supports are provided. Each support includes a strand of wire brazed on either end into threaded studs. One stud is threaded into a topped hole in the end of the magnet cartridge. The stud on the other end extends through a clearance hole on the end flange of the thermal shield. Belleville spring washers are compressed against the shield by a nut. Prior to cool down, the Belleville washers are compressed. As the shield and magnet cool down, the shield contracts axially with respect to the magnet cartridge, thus relaxing the washer stack compression. The wire tension relaxes from the maximum pretension to a nominal tension at operating temperature.

4 Claims, 6 Drawing Sheets

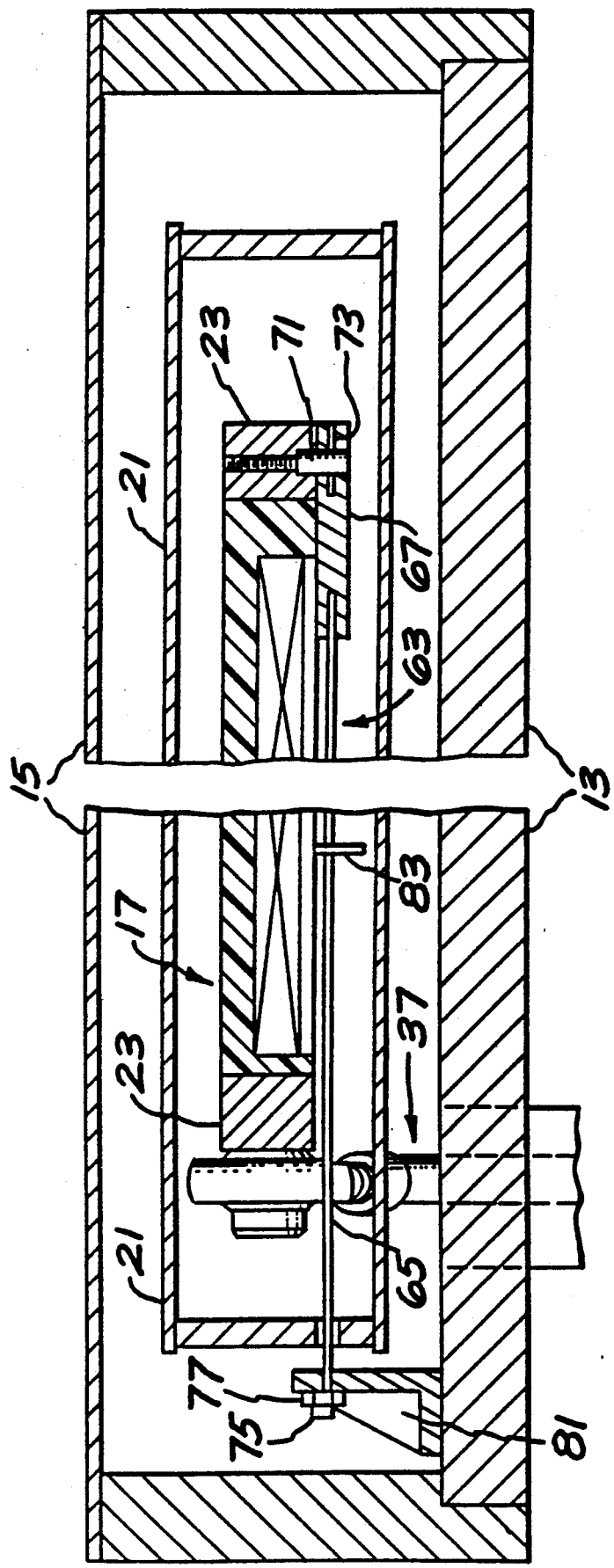

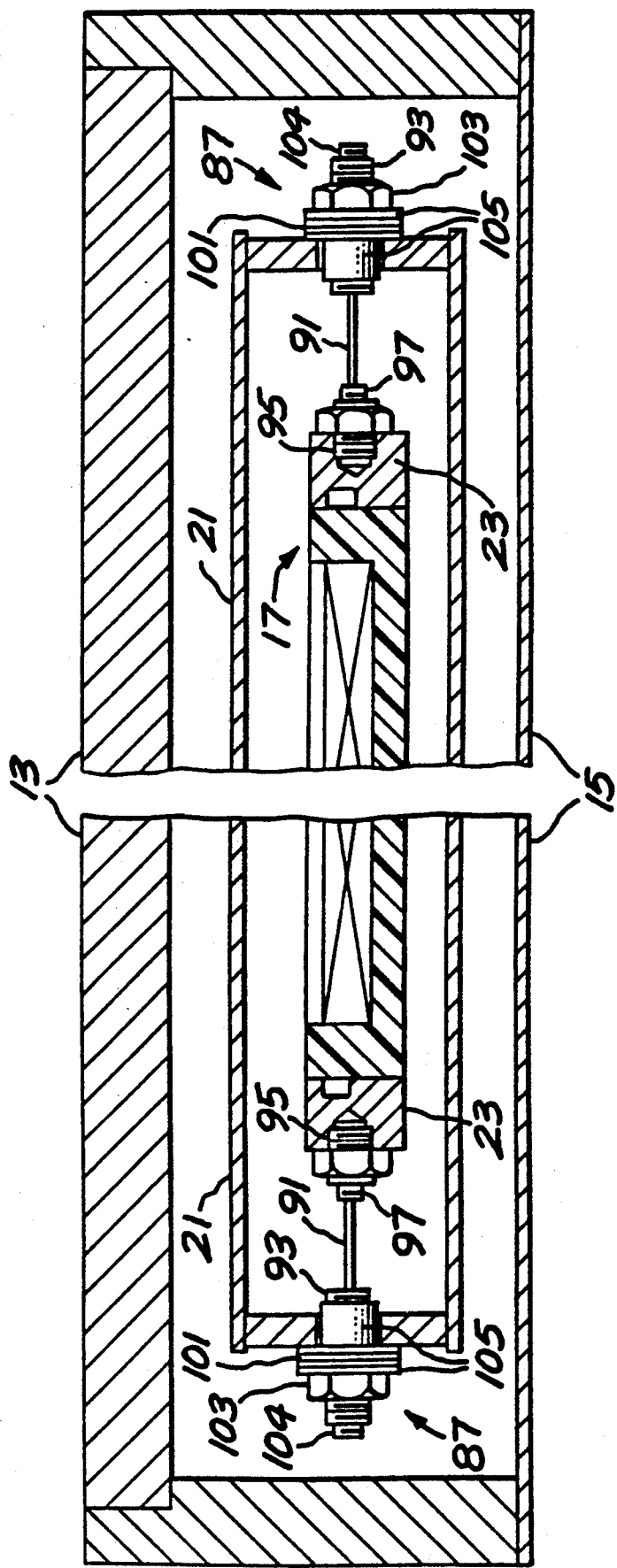

AXIAL THERMAL SHIELD SUPPORT FOR A MR MAGNET

BACKGROUND OF THE INVENTION

The present invention relates to radial support systems for refrigerated magnetic resonance magnets.

The economical operation of a refrigerated superconducting magnet requires that the heat load and hence the refrigeration load to the magnet windings be minimized. In cryostat systems which have a light weight, thin walled thermal shield cooled by a cryocooler, it is advantageous to support the thermal shield from the magnet cartridge. This allows the magnet cartridge and thermal shield to be assembled together prior to insertion in the vacuum vessel. The magnet cartridge, which is the primary mass within the enclosure, is independently supported by the vacuum vessel.

In order to minimize the conduction heat leak from the vacuum vessel and thermal shield to the magnet cartridge, it is necessary to use supports made with low thermal conductivity materials, minimized cross sectional area, and maximized length. The supports must be designed to minimize the deformation of the magnet cartridge and the thermal shield due to the reaction forces at the attachment points of the supports. The supports must permit the axial and radial positioning of the magnet cartridge and the thermal shield within the vacuum vessel. The adjustment mechanisms must be compatible with the overall cryostat assembly procedure.

During the cool down of the magnet from room temperature to operating temperature, there is normally a finite differential thermal contraction between the magnet cartridge, the thermal shield, and the outer vacuum vessel. The supports must accommodate this differential thermal contraction and maintain adequate support at operating temperatures.

The supports must be capable of withstanding the forces due to the dynamic shock loading of the system during shipping and handling. Shock loads during shipping have been measured at approximately 2 g vertical, and 1 g horizontal.

During the ramp up of a magnet during which the current in the windings is increased to their operating level, the magnet cartridge typically expands radially due to magnetic forces. There must be no frictional heating between the magnet cartridge and the supports during ramp up, as this could induce a local temperature rise in the magnet and lead to a magnet quench (transition from superconducting to normal resistance in the superconductive windings).

It is an object of the present invention to provide an axial thermal shield support to minimize heat input to the magnet cartridge while maintaining adequate mechanical strength and adjustment capability.

SUMMARY OF THE INVENTION

A superconductive MR magnet is provided including a generally cylindrical vacuum vessel defining an axially extending bore. A magnet cartridge having a cylindrical shape is situated in the vacuum vessel concentric with and spaced away from the bore of the magnet. A thermal shield surrounds the magnet cartridge and is spaced away from the magnet cartridge and the vacuum vessel. A pair of thermal shield axial supports, each support including a wire tensioned between an end of the magnet cartridge and an adjacent end of the thermal shield, and means for securing the wire to said thermal shield so that as the end of the thermal shield and the end of the magnet cartridge move towards one another, the tension in the wire is reduced elastically.

BRIEF DESCRIPTION OF THE DRAWING

The subject matter which is regarded as the invention is particularly pointed out and distinctly claimed in the concluding portion of the specification. The invention, however, both as to organization and method of practice, together with further objects and advantages thereof, may best be understood by reference to the following description taken in conjunction with accompanying figures in which:

FIG. 5 is a partial side view taken along the lines 5—5 of FIG. 1 of the other magnet cartridge radial strut of the radial strut pair; and FIG. 6 is a partial side view taken along the lines 6—6 of the axial thermal shield supports.

DETAILED DESCRIPTION OF THE INVENTION

Figure 1:
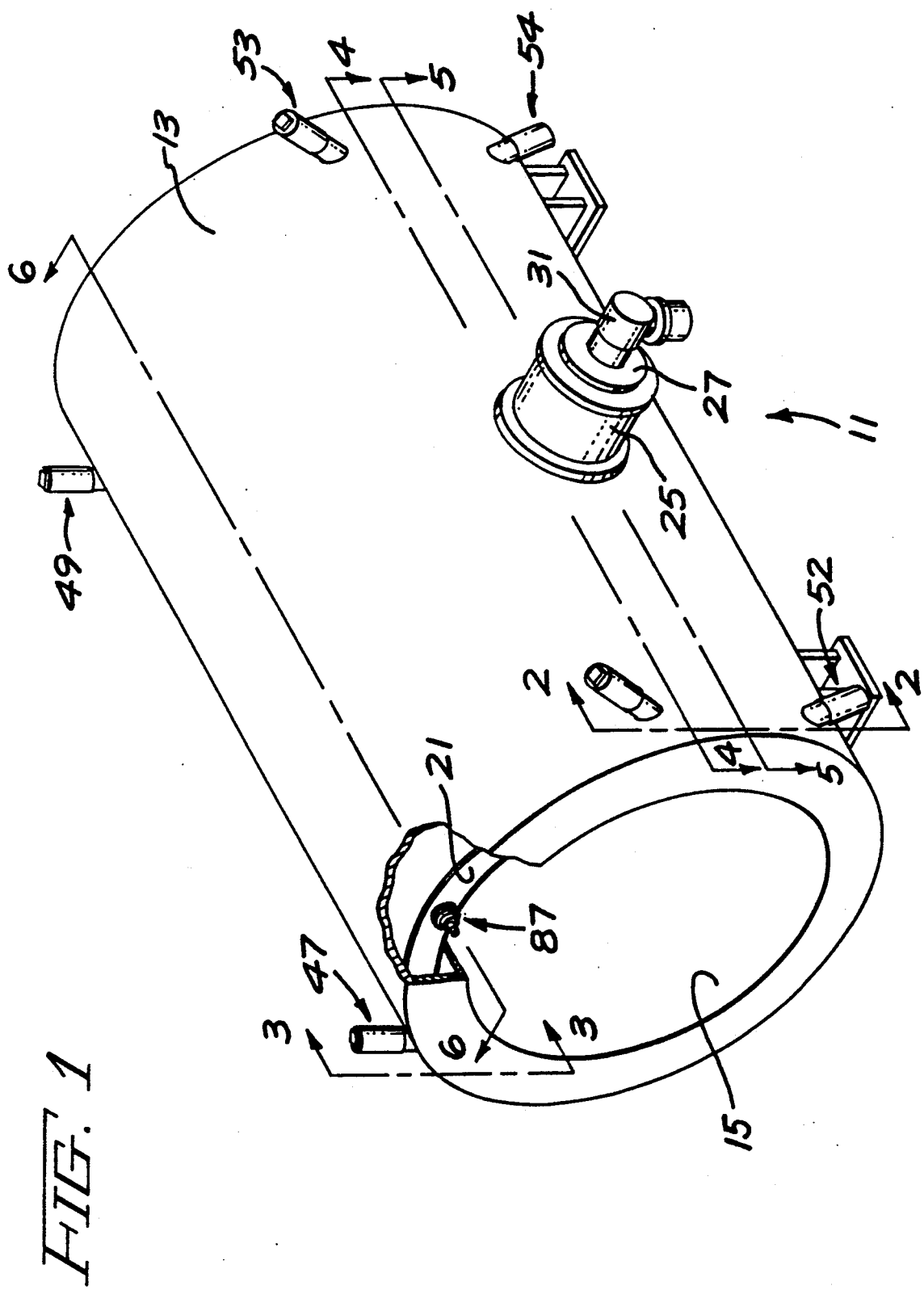
FIG. 1 is an isometric view with a cutaway of the vacuum vessel showing the position of the magnet cartridge radial struts and the shield axial supports in accordance with the present invention.
Figure 2:
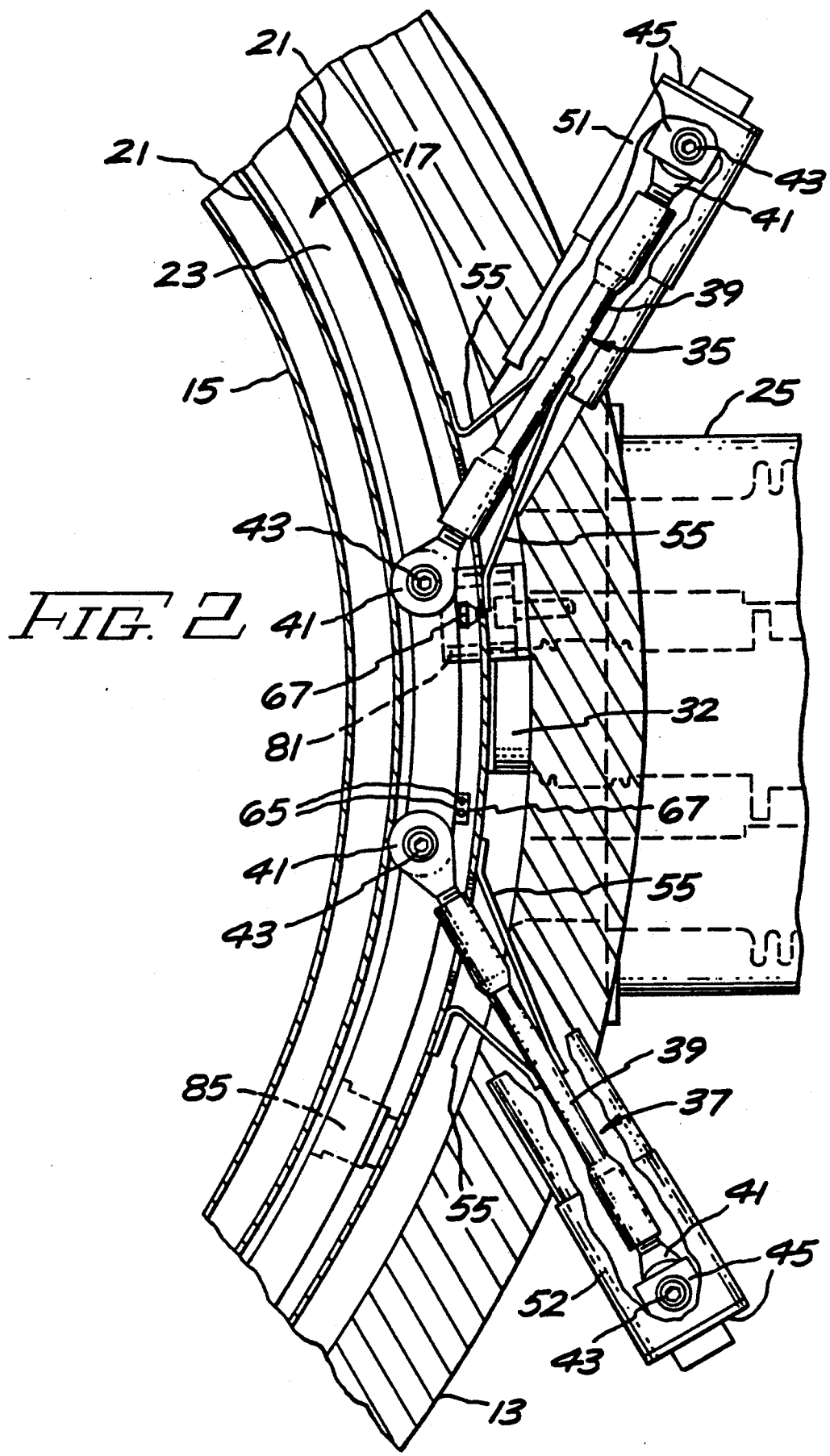
FIG. 2 is a partial sectional end view taken along the lines 2—2 of FIG. 1 showing the lateral magnet cartridge radial struts and magnet cartridge axial struts on the cryocooler side, of the vacuum vessel.
Figure 3:
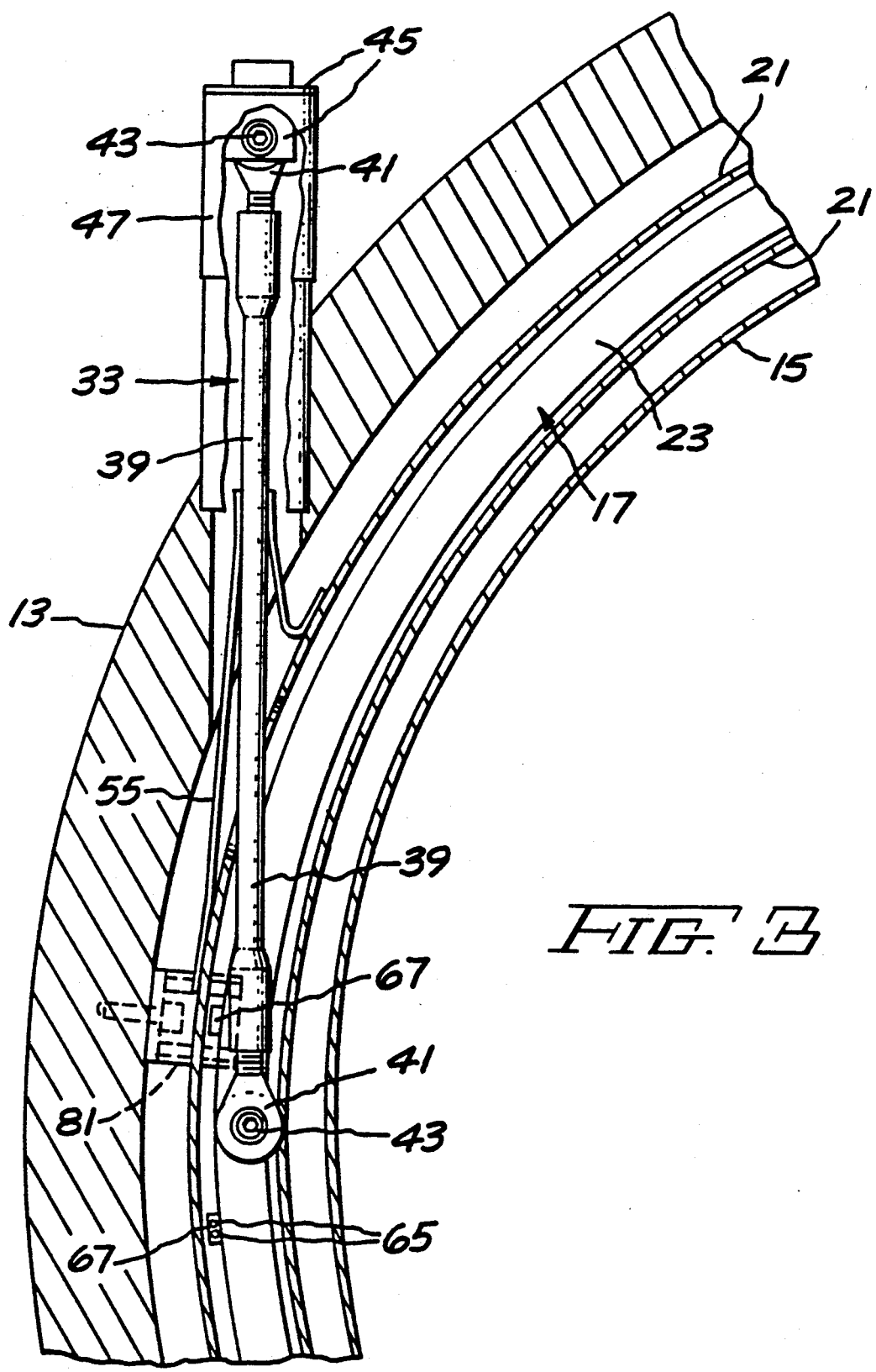
FIG. 3 is a partial sectional end view taken along the lines 3—3 of FIG. 1 showing the vertical magnet cartridge radial struts and magnet cartridge axial struts.

Referring now to the drawing wherein like numerals indicate like elements throughout and particularly FIGS. 1, 2 and 3 thereof, a refrigerated superconductive magnetic resonance (MR) magnet 11 is shown. The magnet includes a cylindrical vacuum vessel 13 having an axially extending bore 15. Located inside the vacuum vessel is a cylindrical magnet cartridge 17 surrounded by a thermal radiation shield 21. The magnet cartridge contains a plurality of windings symmetrically disposed about the axial centerline of the cartridge. In the present embodiment three pairs of superconductive $Nb_3Sn$ windings are wound on a fiberglass reinforced form which has been machined by provide circumferential slots for winding the superconductive coils and axial slots for electrical bus bars connecting the coils together. A winding of this type is shown and claimed in copending application entitled "Superconductive Quench Protected Magnet Coil", Ser. No. 07/412,254 a continuation of Ser. No. 07/215,479, now abandoned and hereby incorporated by reference. A stainless steel end ring 23 is affixed to either end of the cartridge by threaded bolts and epoxy resin bonding.

The vacuum vessel has a cylindrical extension 25 which protrudes radially outwardly from the vacuum vessel in the horizontal direction. The central axis of the extension lies on a radial line extending through the axial midplane of the vacuum vessel. The cylindrical extension has an annular shaped cover 27. A two stage cryocooler 31 is mounted to the cover with the cold end of the cryocooler extending inside the vacuum vessel. The cryocooler 31 is mounted using an interface of the type shown and claimed in copending application Ser. No. 07/348,322 now U.S. Pat. No. 4,930,318 entitled "Cryocooler Cold Head Interface Receptacle". The cryocooler cold end 32, visible in FIG. 2, typically transmits a force of approximately 1000 pounds on the center portion of the magnet cartridge when the vacuum vessel is evacuated. The vacuum vessel and the cylindrical extension can be fabricated from carbon steel with the bore sleeve fabricated from stainless steel, for example.

There are six magnet cartridge radial struts supporting the magnet cartridge from the vacuum vessel. Two of the struts are arranged in the vertical direction and are affixed at either axial end of the magnet cartridge in the horizontal plane on the side of the cartridge opposite the cryocooler. Vertical strut 33 is shown in FIG. 3. Four of the magnet cartridge struts extend laterally. Two lateral struts 35 and 37 are shown in FIG. 2 and are affixed to one end of the magnet cartridge above and below the horizontal plane forming an acute angle when measured from the horizontal plane. The other end of both struts 35 and 37 are affixed to the vacuum vessel with strut 35 extending upwards at an angle and strut 37 extending downwards at an angle toward the vacuum vessel. The other two lateral struts are affixed to the other axial end of the magnet cartridge above and below the horizontal plane symmetrically located about the horizontal midplane of the vacuum vessel on the cryocooler side of the magnet.

Each of the magnet cartridge radial struts comprise a thin walled, G-10 fiberglass epoxy cylinder 39 which has internal threads machined in either end. The central portion of the fiberglass cylinder is machined to reduce its outside diameter or wall thickness and therefore its heat conductance. The transition between the narrow central portion and the ends has a ⅜ inch radius stress riser. The threads in either end stop one quarter of an inch before the reduced diameter portion of the cylinder begins. Threaded into either end of the fiberglass epoxy cylinder is a multiaxis joint 41 such as a ball joint of the type available from Aurora Bearing Corp., Aurora, Ill. The struts are secured to the magnet cartridge by axially extending shoulder bolts 43 passing through the multiaxis joint threadingly engaging ring 23. The other end of each of the radial struts is attached to a clevis 45. The vertical struts each pass through openings in the thermal shield and the vacuum vessel, and are surrounded by vertical cylindrical extensions 47 and 49 and the vacuum vessel. The lateral struts each pass through openings in the thermal shield and vacuum vessel and are surrounded by cylindrical extensions 51, 52, 53 and 54. Part of the clevis 45 is used to close off the end of the cylindrical extension. The lateral extending radial struts pass through openings in the vacuum vessel and through cylindrical extensions closed off by a portion of the clevis which is attached to the ends of the strut.

The vertical and lateral struts are thermally stationed to the thermal shield 21 at an intermediate location in order to intercept some of the conduction heat from the vacuum vessel which is at ambient temperature and carry it to the shield which is cooled to approximately 40° K. by the cryocooler 31. The thermal shield can be fabricated from a heat conductive material such as aluminum. Copper braid 55 is epoxy bonded to the strut and soldered or bolted (with an appropriate interface material) to the shield to conduct the heat from the strut to the shield.

In operation, the two vertical support struts 33 support half of the weight of the magnet cartridge 17. The magnet cartridge in a 0.5T magnet typically weighs approximately 1,000 lbs. The two pairs of lateral struts 35 and 37 react against the contact force of the cryocooler cold head and support half of the weight of the cartridge. The multiaxis joints 41 of the vertical supports pivot to allow the magnet cartridge axial centerline to move due to the thermal shrinkage towards the cryocooler 31 during cool down. The lateral struts do not permit unrestricted motion in the radial direction in the horizontal plane. The initial position of the magnet cartridge is offset so that when shrinkage of the magnet cartridge occurs, the vertical struts will be in the vertical position. The magnet cartridge shrinks radially inward when cooled. Since the lateral struts prevent movement of one side of the magnet cartridge, the center and opposite side of the magnet cartridge move towards the cryocooler. All the radial struts are attached to the magnet cartridge near the horizontal center plane in order to minimize the sag of the cartridge due to its own weight. During assembly, the ends of the vacuum vessel are not yet in place. The magnet cartridge 17 and thermal shield 21 are positioned in the vacuum vessel 13. The clevises 45 are affixed to the warm end of the struts, and are positioned through the cylindrical extensions into the vacuum vessel. The thermal braid heat stations 55 are attached to the thermal shield and the struts are secured to the magnet cartridge using shoulder bolts 43. The cryocooler 31 is installed, or a radially inward force equivalent to the cryocooler is imposed on the magnet cartridge when the radial struts are adjusted. Alternatively, the cryocooler is not installed, but the deformation of the magnet cartridge is anticipated during radial strut adjustment. Once installed the radial struts carry the radial load while being adjusted. The clevises are rotated to achieve radial adjustment of the magnet cartridge position. Rotating the clevis adjusts the overall length between the threaded multiaxis supports of each strut. When the radial adjustment is achieved, each clevis mount is welded to each end of the cylindrical extension to form a vacuum seal.

The angle chosen for the lateral struts depends on the load imposed, as well as the length of the strut desired to minimize the conduction heat load to the magnet cartridge. A longer strut provides less heat conduction. Flexibility in angle selection is available: increasing angles measured relative to the horizontal plane increase the length of the struts, the load on the struts, and the size of the opening in the thermal shield.

Figure 4:
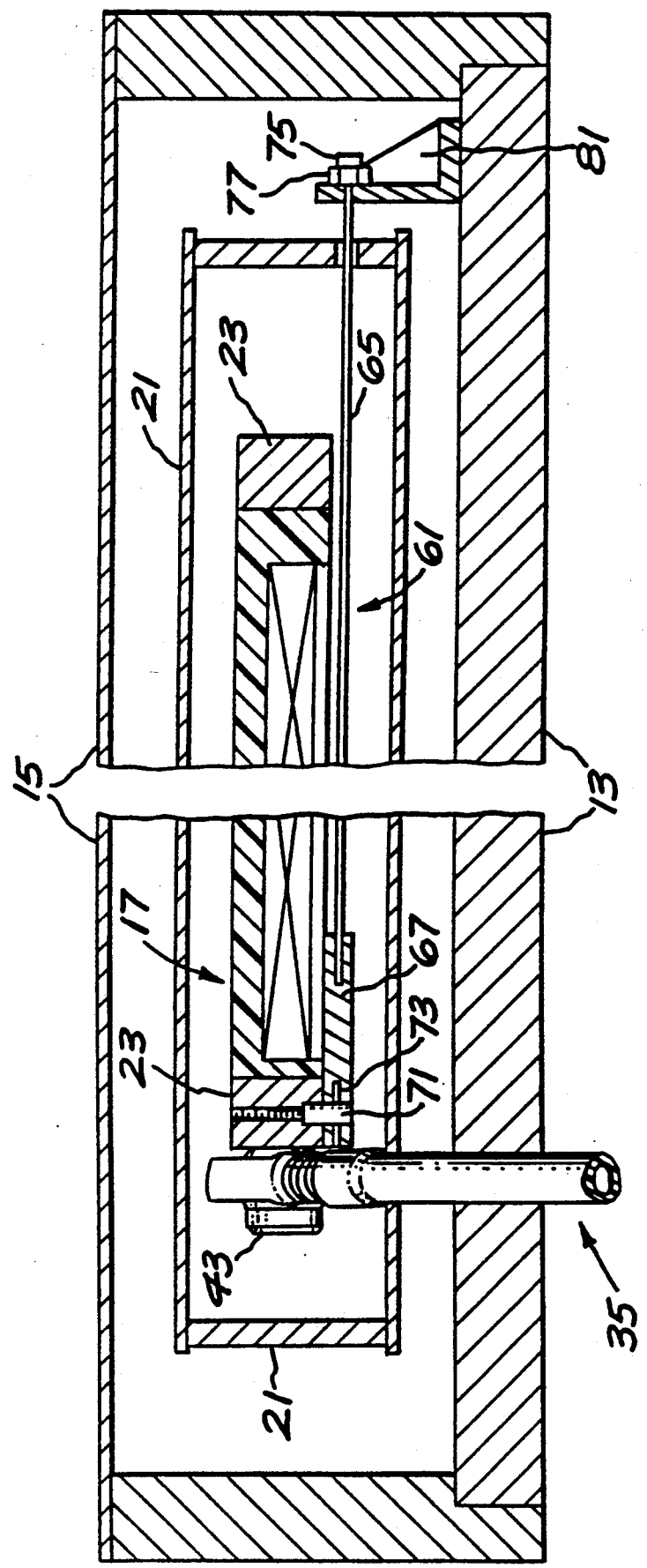
FIG. 4 is a partial side view taken along the lines 4—4 of FIG. 1 of one of the magnet cartridge radial struts of a radial strut pair.

Referring now to FIGS. 4 and 5, two of the four magnet cartridge axial supports 61 and 63 are shown. Each support comprises two high strength steel rods 65 in parallel. Both rods can be seen in FIGS. 2 and 3. If a single wire having sufficient strength is available it can alternatively be used. The rods are brazed on one end into a bar 67 which mounts to the magnet cartridge end ring 23 by means of a threaded stud with a shoulder 71. The stud is held in place with a roll pin 73. The bar and stud attachment to the cartridge are designed to have a minimum thickness radially in order to fit within the annular gap between the cartridge and the thermal shield.

The other end of the steel rods are brazed into a threaded stud 75. This stud is bolted by nut 77 to a bracket 81 which is mounted to the vacuum vessel. The bracket allows the radial position of the stud to be adjusted, if necessary. The threaded stud is sufficiently long to permit the axial positioning of the cartridge within the vacuum vessel. The rods are prevented from thermally shorting to either the cartridge or the shield along the midlength by five equally spaced thermal standoffs 83 made of 0.010 inch G-10. The standoffs insure that the rods are not directly contacting either surface, and conduct only minute amounts of heat from the shield or to the cartridge. Wires provide an inexpensive axial support. Having separate radial and axial magnetic cartridge supports simplify assembly and adjustment. Long thin wires minimize the heat load and do not require thermal stationing to the thermal shield.

The magnet cartridge axial supports are mounted in pairs with a pair diametrically opposite the first pair shown in FIGS. 5 and 6. Each axial support prevents axial motion in one axial direction. The pair prevents axial motion in either direction.

Rotation about the vertical axis of the magnet cartridge is prevented by the radial struts and axial cables. Rotation about the radial direction lying in the horizontal plane of the magnet cartridge is prevented by the lateral struts. Rotation about the axially extending axis is prevented by the vertical and lateral radial struts.

Thermal shield radial bumpers 85 shown in FIG. 2 are described in copending application Ser. No. 07/215,111, now U.S. Pat. No. 4,935,714 entitled "Low Thermal Conductance Support for a Radiation Shield in a MR Magnet", are used to support the thermal shield from the magnet cartridge. U.S. Pat. No. 4,935,714, entitled "Low Thermal Conductance Support for a Radiation Shield in a MR Magnet" is hereby incorporated by reference.

Two of the four thermal shield axial supports 87 are shown in FIG. 6. A single strand of wire 91 is brazed into threaded studs 93 and 95 on each end. Stud 95 is threaded into a tapped hole in ring 23 on the end of the magnet cartridge. Flats 97 are machined on the stud prior to brazing in order to facilitate the insertion and removal of the stud. Stud 93 extends through a clearance hole in the end flange of the thermal shield 21. Belleville spring washers 101 are compressed against the shield by a nut 103. Stud 93 has machined flats 104 to facilitate the tightening of the nut without twisting the wire. A collar 105 between the stud 93 and the stack of spring washers 101 aligns the washers and prevents contact with the stud threads. Stud 93 is of sufficient length to permit adjustability of the axial position of the shield and to accommodate dimensional tolerance stackups. Two additional axial supports (not shown) are used on either end of the magnet cartridge, mounted 180° apart on the end flanges.

Prior to cool down of the magnet cartridge 17 the Belleville washers 101 are compressed. As the shield 21 and magnet cartridge 17 cool down, the shield contracts axially with respect to the magnet cartridge, thus relaxing the washer stacked compression. The wire tension relaxes from the maximum pretension to a nominal tension at operating temperature. Wires provide an inexpensive axial support. Having separate radial and axial shield supports simplify initial adjustments.

The foregoing has described an axial thermal shield support system to minimize heat input to the magnet cartridge while maintaining adequate mechanical strength and adjustment capability.

While the invention has been particularly shown and described with reference to an embodiment thereof, it will be understood by those skilled in the art that various changes in form and detail may be made without departing from the spirit and scope of the invention.

What is claimed is:

1. A superconductive MR magnet comprising:
    a generally cylindrical vacuum vessel defining an axially extending bore;
    a magnet cartridge having a cylindrical shape and situated in the vacuum vessel concentric with and spaced away from the bore of the magnet;
    a thermal shield surrounding said magnet cartridge and spaced away from said magnet cartridge and said vacuum vessel; and
    a pair of thermal shield axial supports, each support comprising a wire tensioned between an end of the magnet cartridge and an adjacent end of the thermal shield, and means for securing said wire to said thermal shield so that as the end thermal shield and the end of the magnet cartridge move towards one another, the tension in the wire is reduced elastically.

2. The superconductive MR magnet of claim 1 wherein said pair of thermal shield axial supports lie on the same axial line.

3. The superconductive MR magnet of claim 1 wherein said means for securing said wire to said thermal shield comprises a threaded stud affixed to said wire, an aperture defined in said thermal shield, a nut, and a stack of conical washers, said threaded stud extending from the interior to the exterior of said thermal shield, said nut capturing a stack of conical washers between said nut and said thermal shield elastically tensioning said wire.

4. The superconductive MR magnet of claim 1 wherein said pair of thermal shield axial supports is further comprised of:
    an end cap means having two sides with said first side rigidly attached to said magnet cartridge;
    a fastener means threadedly fastened to said second side of end cap means such that said wire is secured in said fastener means.

* * * * *